United States Patent [19]
Self

[11] Patent Number: 5,859,538
[45] Date of Patent: *Jan. 12, 1999

[54] METHOD AND APPARATUS FOR CONNECTING A BALL GRID ARRAY DEVICE TO A TEST INSTRUMENT TO FACILITATE THE MONITORING OF INDIVIDUAL SIGNALS OR THE INTERRUPTION OF INDIVIDUAL SIGNALS OR BOTH

[75] Inventor: Bob J. Self, Colorado Springs, Colo.

[73] Assignee: Hewlett-Packard Company, Palo Alto, Calif.

[ * ] Notice: This patent issued on a continued prosecution application filed under 37 CFR 1.53(d), and is subject to the twenty year patent term provisions of 35 U.S.C. 154(a)(2).

[21] Appl. No.: 594,189

[22] Filed: Jan. 31, 1996

[51] Int. Cl.$^6$ .................................................. G01R 31/02
[52] U.S. Cl. ..................... 324/755; 324/765; 324/158.1
[58] Field of Search .................................. 324/754, 755, 324/765, 158.1; 439/68, 69

[56] References Cited

U.S. PATENT DOCUMENTS

| | | | |
|---|---|---|---|
| 5,532,612 | 7/1996 | Liang | 324/760 |
| 5,537,051 | 7/1996 | Jalloul et al. | 324/758 |
| 5,548,223 | 8/1996 | Cole et al. | 324/754 |
| 5,570,033 | 10/1996 | Staab | 324/761 |
| 5,641,297 | 6/1997 | Kozel | 439/342 |
| 5,645,433 | 7/1997 | Johnson | 439/66 |

FOREIGN PATENT DOCUMENTS

| | | |
|---|---|---|
| 2290176 | 12/1995 | United Kingdom . |
| 2302769 | 1/1997 | United Kingdom . |

OTHER PUBLICATIONS

Author: AMP Incorporated, Title: Mictor Matched Impedance Connector System, Date: Revised May 1995, pp. 1–2, Catalog 65560.

Author: Method Electronics, Inc., Title: Ball Grid Array Socketing System, Date: not listed, p. 4.

Primary Examiner—Ernest F. Karlsen
Assistant Examiner—Russell M. Kobert
Attorney, Agent, or Firm—Patrick J. Murphy

[57] ABSTRACT

A probe assembly provides the capability to test integrated circuit (IC) packages mounted onto ball grid arrays. The probe assembly comprises a ball grid probe having connectors mounted onto opposite sides of a circuit board. A first BGA header is mounted to one side of the probe while a first BGA socket is mounted to the other side of the probe. The socket is adapted to receive an integrated circuit which is mounted onto a second BGA header. A second BGA socket is mounted to a printed circuit board and is adapted to receive the ball grid probe via the first BGA header. An interconnection device is provided to electrically couple the ball grid probe to a number of test instruments.

2 Claims, 4 Drawing Sheets

METHOD AND APPARATUS FOR CONNECTING A BALL GRID ARRAY DEVICE TO A TEST INSTRUMENT TO FACILITATE THE MONITORING OF INDIVIDUAL SIGNALS OR THE INTERRUPTION OF INDIVIDUAL SIGNALS OR BOTH

FIELD OF THE INVENTION

The present invention relates generally to electronic test instruments and more particularly to a test probe assembly for electrically connecting a ball grid array surface mount package to an electronic measurement device.

BACKGROUND OF THE INVENTION

Ball grid array (BGA) is fast becoming the package of choice in the surface mount technology arena. BGAs offer many advantages over standard fine-pitch surface mount and pin grid array technologies. These advantages include reduced placement problems since BGAs are self-centering, reduced handling issues because there are no leads to damage, lower profile and higher interconnect density. There is, however, a significant drawback with BGA technology: the lack of established BGA test accessories and procedures.

Electronic test instruments (e.g., oscilloscope, logic analyzer, emulator) are used to analyze various electrical aspects of the IC including voltage and current waveforms. Typically, a loaded printed circuit board is crowded with various electrical components, including multiple IC packages. Due to the close spacing of components on the board (i.e., high "board density") it is often difficult to electrically connect the ICs to the test instrument. BGAs only exacerbate this problem since there are no "leads" to access for testing purposes.

SUMMARY OF THE INVENTION

The present invention provides a probe assembly for testing integrated circuit packages which are mounted using ball grid arrays. The probe assembly comprises a ball grid probe which electrically connects BGA devices (i.e., ICs mounted using ball grid arrays) to test instruments. The ball grid probe comprises a BGA socket and a BGA header mounted to opposite sides of a multilayered circuit board. The BGA socket is configured to accept an integrated circuit that is mounted onto a second BGA header. After the integrated circuit is connected to the ball grid probe, the entire assembly is then connected to a printed circuit board via a second BGA socket. Means for interconnecting the ball grid probe to a test instrument are also provided. The ball grid probe provides the end-user with the capability to passively monitor signals from the integrated circuit as well as interrupt signals for signal conditioning by an emulator, for example.

DETAILED DESCRIPTION OF THE PREFERRED EMBODIMENT

Figure 1:
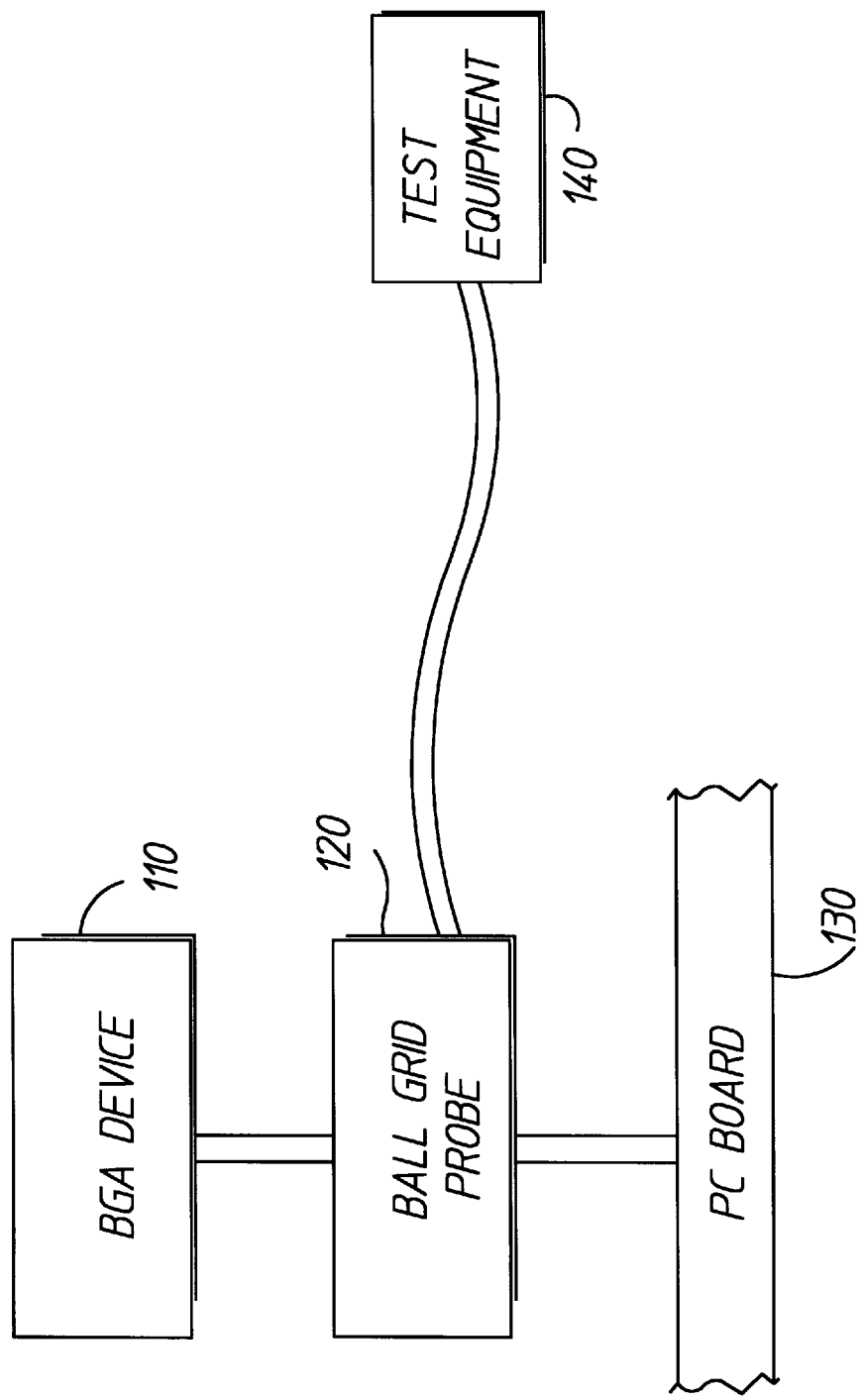
FIG. 1 shows a block diagram of the probe assembly according to the present invention.

FIG. 1 shows a block diagram of the probe assembly according to the present invention. Generally, the probe assembly is interposed between an integrated circuit device mounted onto a ball grid array and a printed circuit board. The probe assembly permits a user to access signals that would otherwise be inaccessible given the configuration of the ball grid array.

Referring now to FIG. 1, a ball grid probe 120 is interposed between a BGA device 110 and a printed circuit board 130. The ball grid probe 120 is connected to a test instrument 140. Test instrument 140 may be an oscilloscope, for example. While FIG. 1 illustrates connection to only one test instrument, the present invention contemplates connecting the BGA device to multiple test instruments at the same time as will be seen below. Other test instruments which can be connected to the BGA device via the ball grid probe include logic analyzers and circuit emulators.

The ball grid probe 120 is configured to allow a user to connect the BGA device 110 that is "in circuit" (i.e., electrically coupled to the printed circuit board 130) to the test instrument 140 to facilitate the monitoring of individual signals or the interruption of individual signals or both. The individual signals are then available for test or signal conditioning.

Figure 2:
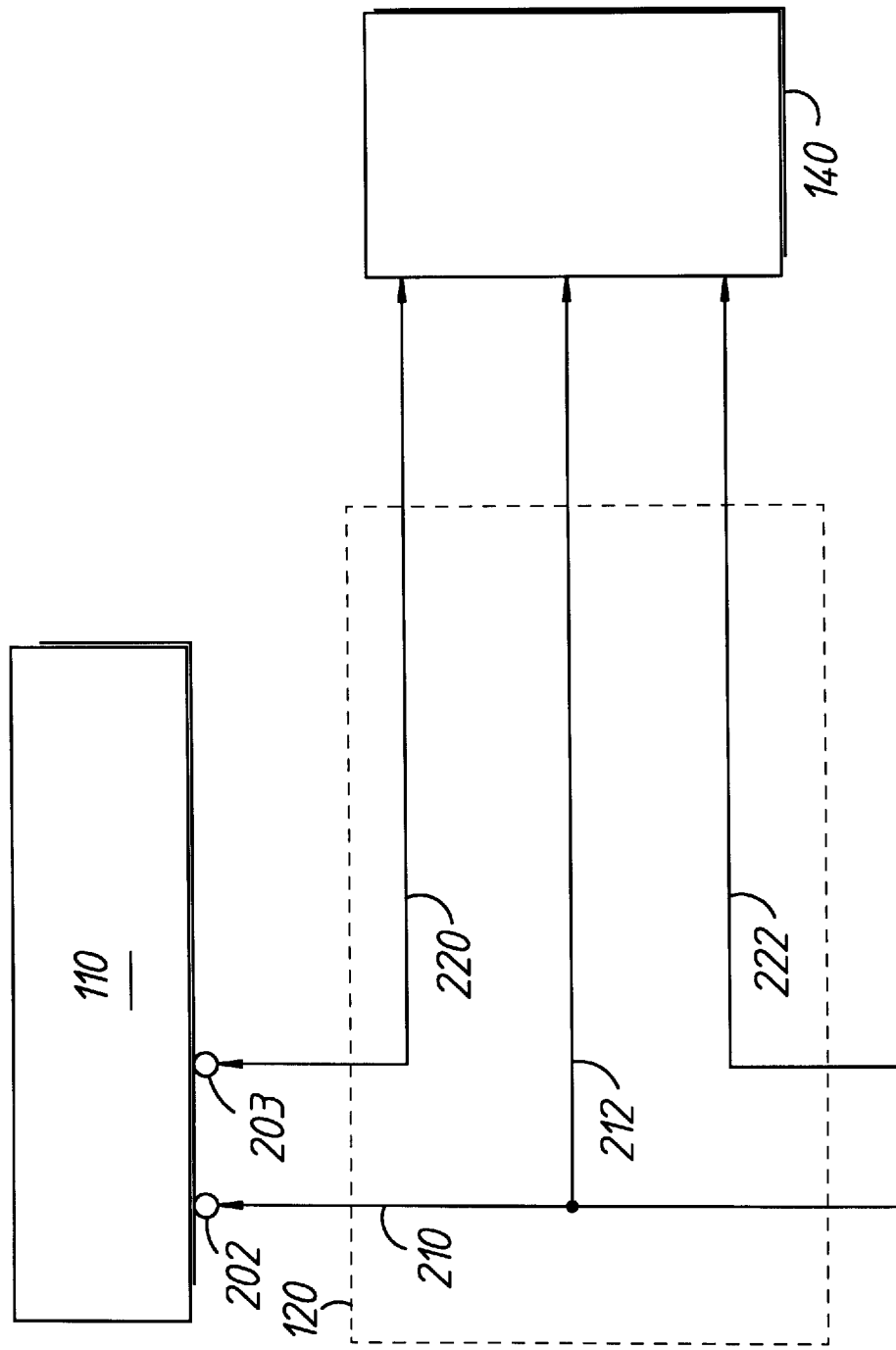
FIG. 2 shows a more detailed block diagram of the probe assembly.

FIG. 2 shows a more detailed block diagram of the probe assembly according to the present invention. The BGA device 110 is illustrated with first and second solder balls 202,203. Again, the ball grid probe 120 is interposed between the BGA device 110 and the printed circuit board (not shown). A feature of the ball grid probe 120 is that signals from the BGA device 110 can either be fed through to the printed circuit board to facilitate passive monitoring of the signal or the signal can be interrupted, routed through the test instrument 140, massaged, and then returned to the system under test.

The first solder ball 202 is connected to data line 210; the second solder ball 203 is connected to data line 220. Data line 212, connected to line 210, permits signal feedthrough and facilitates passive signal testing by the test instrument 140. Data line 220 is connected to the test instrument 140 to allow for signal interrupt. After the signal is conditioned, for example, it is returned to the system via data line 222. Other configurations are possible without departing from the scope of the present invention. For example, the signal emanating from the path at solder ball 202 could be interrupted for signal conditioning while the signal emanating from the path at solder ball 203 could be passively monitored by the test instrument 140 while being fed through to the system under test. The routing of signals is accomplished by using a multilayered printed circuit board as will be discussed in connection with FIG. 3.

Figure 3:
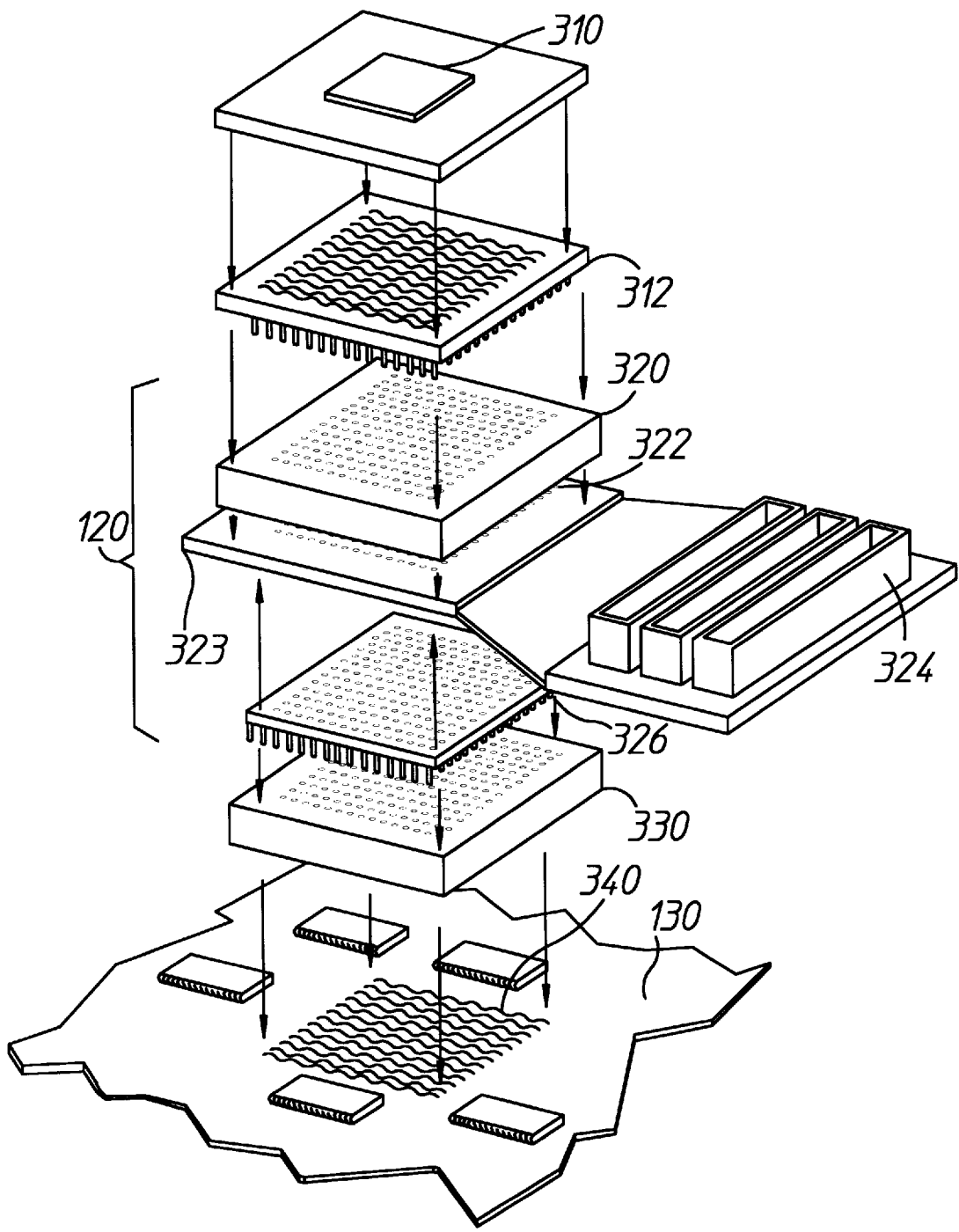
FIG. 3 shows an exploded view of a first preferred embodiment of the probe assembly.

FIG. 3 shows an exploded view of a first preferred embodiment of the probe assembly according to the present invention. The ball grid probe 120 comprises a BGA socket 320 connected to a first side of an interconnect device 324. A BGA header 326 is connected to a second side of the interconnect device 324. The interconnect device 324 comprises first and second conductive pad matrices 322 adapted to receive the BGA socket 320 and BGA header respectively. The interconnect device 324 is configured to connect the ball grid probe 120 to the test instrument (item 140 in FIG. 1).

The BGA socket 320 and BGA header 326 are preferably solder mounted to opposite sides of a multilayered printed circuit board 323 which has signal paths to accommodate the routing of signals between the BGA device, the test instrument, and the printed circuit board. A flex circuit with laminate could also be used in place of the hard board. Additionally, a mix of hard board and flex board could be used to fabricate the ball grid probe 120.

The ball grid probe 120 is adapted to electrically couple the BGA device 310 to the printed circuit board 130. The BGA device 310 is first mounted onto BGA header 312. BGA header 312 is configured to be connected to the BGA socket 320 of the ball grid probe 120. In a preferred embodiment, the BGA header 312 and BGA socket 320 are both comprised of a 19×19 array. Other array configurations are contemplated by the present invention, including arrays which have center voids to accommodate heat dissipation, for example.

BGA socket 330 is surface mountable onto the printed circuit board 130 at pad matrix 340. BGA socket 330 is configured to accept the BGA header 326 of the ball grid probe 120. In a preferred embodiment, the BGA headers (312,326) and BGA sockets (320,330) are available from Methode Electronics, Incorporated, 7447 West Wilson Avenue, Chicago, Ill. Another feature of the present probe assembly is that the BGA device 310, coupled to BGA header 312, can be directly mounted onto the printed circuit board 130 via BGA socket 330 after testing is completed. This connection is easily accomplished by "unplugging" the BGA device from the ball grid probe 120, removing the probe 120, and inserting the BGA device 310 into socket 330.

Figure 4:
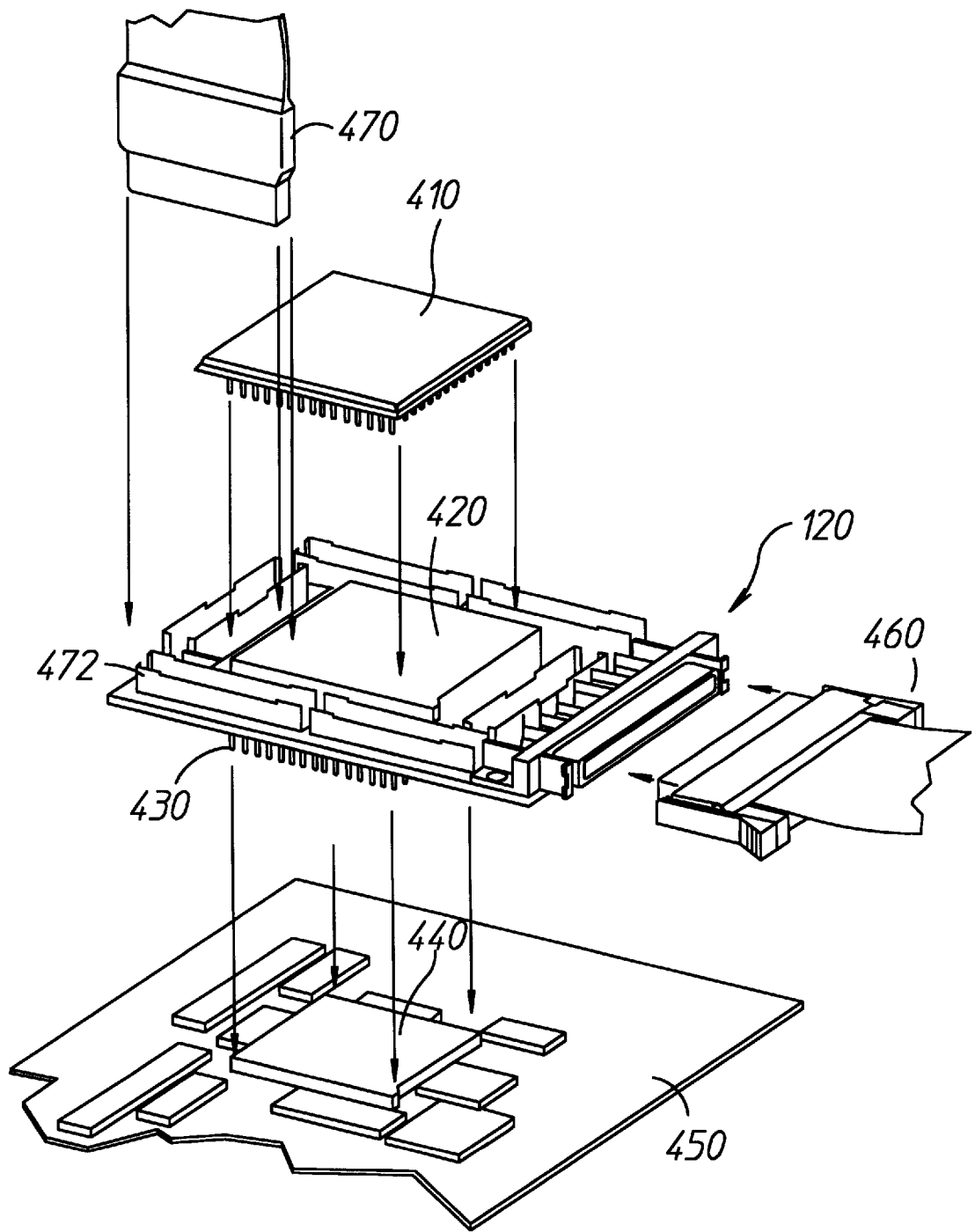
FIG. 4 shows an exploded view of a second preferred embodiment of the probe assembly.

FIG. 4 shows an exploded view of a second preferred embodiment of the probe assembly. The ball grid probe 120 comprises a BGA socket 420 and a BGA header 430 that are connected via pad matrices (not shown). Multiple interconnect devices are shown in this embodiment. A first connector 472 comprises a central ground plane surrounded by two rows of signal contacts. Connector 472 is surface mounted onto the ball grid probe 120 and is configured to accept a cable 470. Cable 470 can be routed to a logic analyzer, for example. A second cable 460 is connected using a standard connector of the type used in RS-323 type of interconnection. This second cable 460 can be routed to another test instrument such as a circuit emulator. In a preferred embodiment, the connector 472 is a Mictor matched impedance connector available from AMP, Incorporated, Harrisburg, Pa.

BGA device 410, mounted onto a BGA header, is connected to the BGA socket 420. The probe 120 is then connected to the printed circuit board 450 by inserting the BGA header 430 into BGA socket 440 which is surface mounted onto the printed circuit board 450.

While the present invention has been illustrated and described in connection with the preferred embodiment, it is not to be limited to the particular structure shown. For example, active circuitry can be mounted onto the circuit board (item 323 in FIG. 3) to facilitate system test and emulation.

What is claimed is:

1. A probe assembly for electrically connecting an integrated circuit package to a test instrument, the integrated circuit package adapted to use a ball grid array (BGA), the probe assembly comprising:

a ball grid probe, the ball grid probe electrically coupled to the integrated circuit package via a first BGA socket;

an interconnect device connected to the first BGA socket, the interconnect device electrically coupled to the test instrument a second BGA socket configured to receive the ball grid probe, the second BGA socket adapted to electrically couple the integrated circuit to a printed circuit board;

a first BGA header connected to the interconnect device, the first BGA header configured to connect to the second BGA socket; and a second BGA header, the second BGA header configured to connect to the first BGA socket.

2. The probe assembly of claim 1, wherein the interconnect device comprises a multilayered printed circuit board having a plurality of signal paths, the plurality of signal paths is configured to route a plurality signals between the integrated circuit and the test instrument, wherein the plurality of signal paths facilitates the monitoring of individual signals or the interruption of individual signals or both.

* * * * *